(12) United States Patent
Park et al.

(10) Patent No.: US 11,573,272 B2
(45) Date of Patent: Feb. 7, 2023

(54) METHOD FOR CALCULATING PROCESS CAPACITY OF LITHIUM SECONDARY BATTERY

(71) Applicant: LG CHEM, LTD., Seoul (KR)

(72) Inventors: Jun Kyu Park, Daejeon (KR); Jeong Min Ha, Daejeon (KR); Jeong Taik Lee, Daejeon (KR); Min Hae Kim, Daejeon (KR); Go Eun Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 17/268,712

(22) PCT Filed: Mar. 5, 2020

(86) PCT No.: PCT/KR2020/095015
§ 371 (c)(1),
(2) Date: Feb. 16, 2021

(87) PCT Pub. No.: WO2020/197364
PCT Pub. Date: Jan. 10, 2020

(65) Prior Publication Data
US 2021/0181259 A1    Jun. 17, 2021

(30) Foreign Application Priority Data
Mar. 26, 2019 (KR) .......................... 10-2019-0034430

(51) Int. Cl.
*G01R 31/374* (2019.01)
*G01R 31/367* (2019.01)
(Continued)

(52) U.S. Cl.
CPC ........ *G01R 31/374* (2019.01); *G01R 31/367* (2019.01); *G01R 31/385* (2019.01);
(Continued)

(58) Field of Classification Search
CPC combination set(s) only.
See application file for complete search history.

(56) References Cited

U.S. PATENT DOCUMENTS

| 5,650,712 A | 7/1997 | Kawai et al. |
| 8,405,356 B2 * | 3/2013 | Nakayama ........... G01R 31/367 320/132 |

(Continued)

FOREIGN PATENT DOCUMENTS

| CN | 106207284 A | 12/2016 | |
| CN | 107765188 A * | 3/2018 | ........... G01R 31/392 |

(Continued)

OTHER PUBLICATIONS

Machine translation of Description for KR20140139356A, translation printed Jun. 17, 2022 (Year: 2022).*

(Continued)

*Primary Examiner* — John C Kuan
(74) *Attorney, Agent, or Firm* — Birch, Stewart, Kolasch & Birch, LLP

(57) ABSTRACT

A method for calculating the process capacity at a specific temperature of a lithium secondary battery includes a correction to a process capacity ($Q_3$) at a specific temperature ($T_2$) is performed using a value ($Q_1-Q_2$) obtained by subtracting the charge capacity ($Q_2$) at the time of the shipping charge from the discharge capacity ($Q_1$) measured at a discharge temperature ($T_1$). A system for calculating a process capacity of a lithium secondary battery is provided.

9 Claims, 3 Drawing Sheets

(51) Int. Cl.
    *G01R 31/387* (2019.01)
    *G01R 31/385* (2019.01)
    *G06F 17/18* (2006.01)
    *G01R 31/36* (2020.01)

(52) U.S. Cl.
    CPC ........ *G01R 31/3648* (2013.01); *G01R 31/387* (2019.01); *G01R 31/3865* (2019.01); *G06F 17/18* (2013.01)

(56) References Cited

U.S. PATENT DOCUMENTS

| | | | |
|---|---|---|---|
| 2002/0014879 | A1 | 2/2002 | Koike et al. |
| 2005/0035743 | A1 | 2/2005 | Kawakami et al. |
| 2009/0037124 | A1* | 2/2009 | Majima ................ G01R 31/374 702/63 |

FOREIGN PATENT DOCUMENTS

| | | |
|---|---|---|
| CN | 108037460 A | 5/2018 |
| CN | 108321444 A | 7/2018 |
| CN | 109444749 A | 3/2019 |
| CN | 109459704 A | 3/2019 |
| JP | 2001-155786 A | 6/2001 |
| JP | 2001-242228 A | 9/2001 |
| JP | 2001-309565 A | 11/2001 |
| JP | 2008-128802 A | 6/2008 |
| JP | 2009-42182 A | 2/2009 |
| JP | 2011-43513 A | 3/2011 |
| JP | 2014-29273 A | 2/2014 |
| JP | 2018045790 A * | 3/2018 |
| KR | 10-2004-0033278 A | 4/2004 |
| KR | 10-2014-0139356 A | 12/2014 |
| KR | 10-1602015 B1 | 3/2016 |
| KR | 10-2017-0033601 A | 3/2017 |

OTHER PUBLICATIONS

International Search Report issued in PCT/KR2020/095015 (PCT/ISA/210), dated Jun. 12, 2020.

Extended European Search Report for European Application No. 20776570.2, dated Sep. 14, 2021.

* cited by examiner

[FIG. 1]
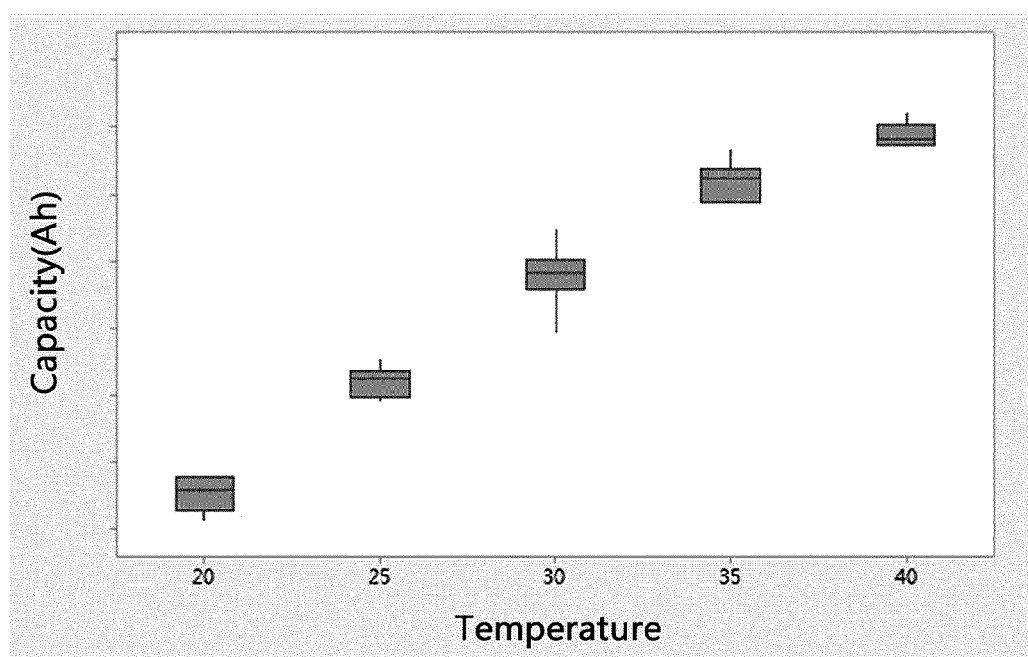

[FIG. 2]
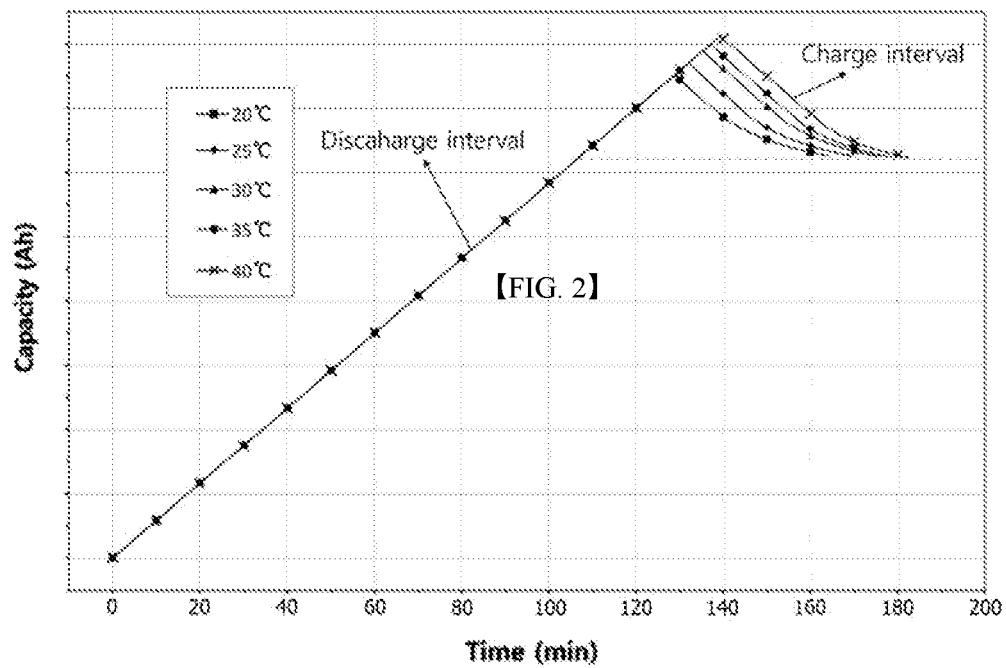
[FIG. 3]
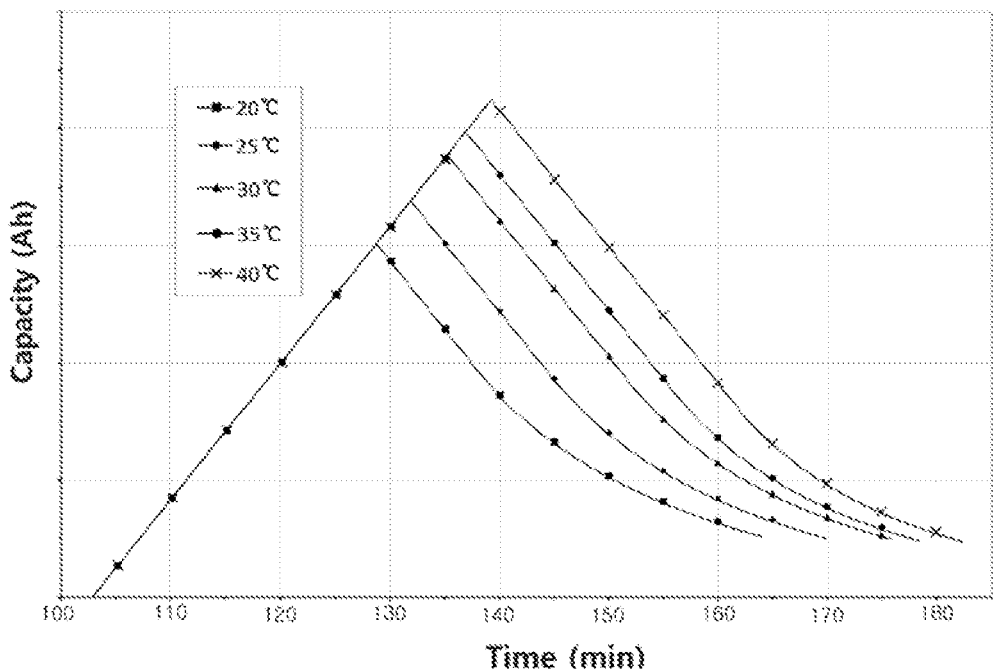

[FIG. 4]
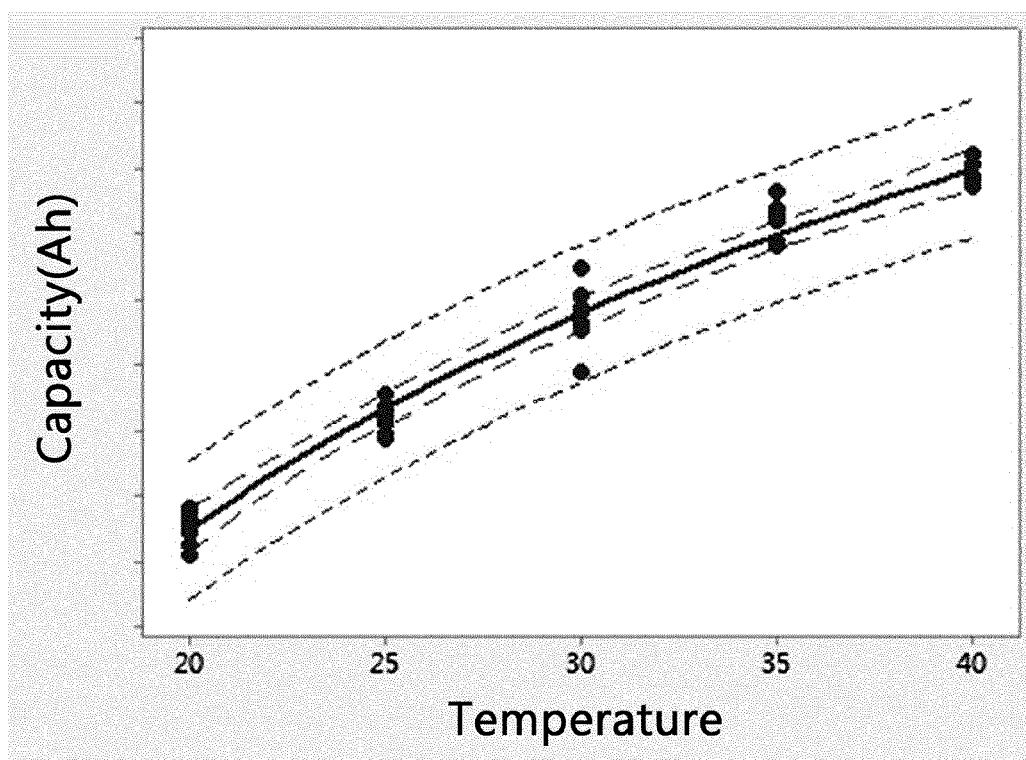

METHOD FOR CALCULATING PROCESS CAPACITY OF LITHIUM SECONDARY BATTERY

TECHNICAL FIELD

This application claims the benefit of priority based on Korean Patent Application No. 10-2019-0034430, filed on Mar. 26, 2019, and the entire contents of the Korean patent application are incorporated herein by reference.

The present invention relates to a method for calculating the process capacity of a lithium secondary battery.

BACKGROUND ART

In order to produce batteries that meet the capacity standards required by customers, manufacturers of lithium secondary batteries measure and check the capacity of the batteries during the manufacturing process and ship the batteries if the measured capacity meets the capacity standard.

Customers usually require the battery's process capacity at a specific temperature, but under a system for manufacturing secondary batteries in large quantities, there are many practical limitations in actually measuring process capacity at a specific temperature desired by the customers and shipping such batteries. Therefore, the capacity of the battery is measured according to the facilities at the production site of the battery or the conditions of the manufacturing process, and this is corrected to a process capacity at a specific temperature required by the customer.

Further, after performing the degassing process for the secondary battery that has completed the activation process, the secondary battery is discharged before the shipping charge. The discharge capacity measured at this time is regarded as the capacity of the battery.

The process of correcting to the process capacity at a specific temperature desired by the customer using the discharge temperature and discharge capacity is as follows. First of all, the lithium secondary battery that has completed the degassing process is fully charged and fully discharged, and the measured values of discharge capacity according to the temperature at the time of discharge are databased. And the correlation function between discharge temperature and discharge capacity is derived through regression analysis from the database, and by using this, a correction equation for correcting the actual measured discharge capacity to the process capacity at a specific temperature desired by the customer is derived. The correction equation compensates for the amount of change in capacity according to the difference in temperature between the discharge temperature and the specific temperature. It is to correct the amount of change in capacity according to the difference in temperature from the actual discharge capacity measured. Further, a process capacity value at a specific temperature is obtained by measuring the temperature and the discharge capacity at the time of discharge and substituting the measured discharge temperature and the discharge capacity into the correction equation.

Therefore, in order to guarantee consistency that the process capacity calculated by the above correction equation matches the actual process capacity, the discharge temperature and discharge capacity applied to the correction equation should be accurate values.

However, since it is impossible to measure the discharge temperature individually for a large number of secondary batteries under a mass system, a plurality of temperature measurement sensors are installed in a chamber in which secondary batteries are accommodated, and an average value of the temperatures measured by the installed sensors is obtained to thereby uniformly consider the average value as the temperature of the secondary batteries in the chamber. As a result, there may be a case where the actual discharge temperature and the discharge temperature measured by the sensor do not match. That is, the discharge capacity measured during the discharge process may not match the discharge capacity at the measured discharge temperature. Due to this inconsistency, the process capacity value calculated by the conventional method of calculating the process capacity by correcting the change in capacity due to the difference between the discharge temperature and the specific temperature, in the discharge capacity value, can cause inconsistency with actual process capacity. In addition, this inconsistency may be intensified as the increase in the battery capacity due to high loading/high energy tendency, or mass production, in which the number of secondary batteries in the chamber increases, accelerates.

As described above, the discrepancy between the process capacity value calculated using the discharge capacity and the discharge temperature measured during the discharge process and the process capacity value through actual product inspection is generated because the conventional calculation method is to perform correction based on the value of the discharge capacity, and the value of the discharge capacity is dependent on temperature.

Therefore, there is a need for developing a technology about a correction method that attenuates temperature dependence in calculating a process capacity using a discharge capacity.

DISCLOSURE

Technical Problem

The present invention is a process capacity calculation method for performing correction to a process capacity using a discharge capacity and a discharge temperature, and an object of the present invention is to improve the consistency between the process capacity derived by the correction equation and the actual process capacity by attenuating the temperature dependency.

Technical Solution

A method for calculating a process capacity at a specific temperature of a lithium secondary battery of the present invention for solving the above problems is characterized in correcting to a process capacity ($Q_3$) at a specific temperature ($T_2$) using a value ($Q_1-Q_2$) obtained by subtracting the charge capacity ($Q_2$) at the time of the shipping charge from the discharge capacity ($Q_1$) measured at a discharge temperature ($T_1$).

In the method of calculating a process capacity of the present invention, the shipping charge may be performed by a CC-CV charge method at a temperature of 20° C. to 50° C.

Further, the shipping charge may be performed by charging the lithium secondary battery to a level of SOC 10% to SOC 60%, preferably SOC 10% to SOC 40%.

The method of calculating a process capacity of the present invention may include: an equation deriving step of deriving a regression equation of discharge temperature-discharge capacity through a regression analysis of discharge capacity data according to discharge temperatures;

and a correction equation deriving step of performing correction to a process capacity ($Q_3$) at a specific temperature ($T_2$) from the derived regression equation, in which the derived correction equation may have the value ($Q_1$-$Q_2$), the discharge temperature ($T_1$), and the specific temperature ($T_2$) as variables.

Further, the correction equation for calculating the process capacity of the present invention may have at least one correction factor for compensating for a difference in capacity caused by a difference between the specific temperature ($T_2$) and the discharge temperature ($T_1$).

The method of calculating the process capacity of the present invention may further include a step of multiplying the correction equation by a correction factor to compensate for a difference caused by differences in activation process conditions after the correction equation deriving step.

Further, in the correction equation for calculating the process capacity of the present invention, the discharge temperature (T1) and the discharge capacity (Q1) may be respectively a discharge temperature and a discharge capacity measured while performing a full discharge after a full charge for the lithium secondary battery after having completed a degassing process.

Further, in the correction equation for calculating the process capacity of the present invention, the discharge temperature ($T_1$) may be an average value of temperatures during performing a discharge.

Further, a system for calculating a process capacity of a lithium secondary battery may include: a database unit configured to store discharge capacity data according to a discharge temperature;

an analysis unit configured to derive a correction equation for correcting to a process capacity ($Q_3$) at a specific temperature ($T_2$) through regression analysis of temperature and discharge capacity data stored in the database unit;

a measuring unit configured to measure a discharge temperature ($T_1$) and a discharge capacity ($Q_1$) during a discharge process performed after a degassing process of a lithium secondary battery, and to measure a charge capacity ($Q_2$) during a shipping charge; and a calculation unit configured to calculate the process capacity ($Q_3$) at the specific temperature ($T_2$) by substituting the discharge capacity ($Q_1$), the discharge temperature ($T_1$), and the charge capacity ($Q_2$) measured by the measuring unit into the correction equation derived by the analysis unit, in which the correction equation derived from the analysis unit has the discharge temperature ($T_1$), the discharge capacity ($Q_1$) and the charging capacity ($Q_2$) as variables.

Further, in the system, the shipping charge may be performed by a CC-CV charge method at a temperature of 20° C. to 50° C.

Further, in the system, the shipping charge may be performed by charging to a level of SOC 10% to SOC 60%, preferably SOC 10% to SOC 40%.

Further, in the system, the correction equation may have at least one correction factor for compensating for a difference in capacity caused by a difference between the specific temperature ($T_2$) and the discharge temperature ($T_1$).

Further, in the system, the analysis unit may be configured to multiply the correction equation by a correction factor to compensate for a difference caused by differences in activation process conditions after the analysis unit derives the correction equation.

Further, in the system, the discharge temperature ($T_1$) and the discharge capacity ($Q_1$) of the correction equation may be respectively a discharge temperature and a discharge capacity measured while performing a full discharge after a full charge for the lithium secondary battery after having completed the degassing process.

Further, in the system, the discharge temperature ($T_1$) may be an average value of temperatures during performing a discharge.

Advantageous Effects

According to a method of calculating a process capacity of the present invention, correction is made based on the capacity value obtained by subtracting the charging capacity from the discharge capacity, and as a result, there is an effect that the consistency between the process capacity calculated by the correction and the actual process capacity is improved because the temperature dependency is canceled.

BRIEF DESCRIPTION OF THE DRAWINGS

FIG. 1 is a graph showing a discharge capacity value according to a discharge temperature.

FIG. 2 is a graph showing a discharge capacity and a charge capacity for each temperature.

FIG. 3 is an enlarged graph of the peak portion in FIG. 2.

FIG. 4 is a graph according to a regression analysis according to an embodiment of the present invention.

DETAILED DESCRIPTION OF THE PREFERRED EMBODIMENTS

The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention. Accordingly, the embodiments described in the specification and the configurations described in the drawings are only the most preferred embodiments of the present invention, and do not represent all of the technical ideas of the present invention. It is to be understood that there may be various equivalents and variations in place of them at the time of filing the present application.

In this application, it should be understood that terms such as "include" or "have" are intended to indicate that there is a feature, number, step, operation, component, part, or a combination thereof described on the specification, and they do not exclude in advance the possibility of the presence or addition of one or more other features or numbers, steps, operations, components, parts or combinations thereof.

As used throughout this specification, the terms "about", "substantially", and the like, are used to mean a value or something like this when unique manufacturing and material tolerances are presented, and the terms are used to prevent unscrupulous infringers from unfair use of the disclosure including accurate or absolute figures in order to aid in the understanding of the present disclosure.

In the specification of the present invention, the process capacity is a concept including all of the capacity of the battery at a specific temperature $T_2$ required by the customer, the production capacity of the secondary battery, the standard capacity of the secondary battery, and the capacity of the secondary battery.

In the specification of the present invention, the specific temperature ($T_2$) refers to the temperature condition of the process capacity ($Q_3$) required by the customer.

Hereinafter, the present invention will be described in detail.

In the method for calculating the process capacity of a lithium secondary battery according to the present invention, a new method of correcting to a process capacity ($Q_3$) at a specific temperature ($T_2$) using a value ($Q_1-Q_2$) obtained by subtracting the charge capacity ($Q_2$) at the time of the shipping charge from the discharge capacity ($Q_1$) measured at an arbitrary discharge temperature ($T_1$) is proposed.

The correction equation of the conventional process capacity calculation method is a method of correcting the amount of change in capacity due to the difference between the discharge temperature $T_1$ and the specific temperature $T_2$ in the discharge capacity $Q_1$. According to such a conventional method, correction is made based on the discharge capacity $Q_1$, but in the correction equation used when calculating the process capacity of the present invention, correction is made by the amount of change in capacity due to the difference between the discharge temperature ($T_1$) and the specific temperature ($T_2$), based on the discharge capacity minus the charge capacity at the time of shipping charge ($Q_1-Q_2$), not based on the discharge capacity ($Q_1$).

In the conventional correction equation, discharge capacity ($Q_1$), discharge temperature ($T_1$) and specific temperature ($T_2$) are independent variables, and in order to correct the difference in capacity due to the difference between the discharge temperature ($T_1$) and the specific temperature ($T_2$), the conventional correction equation has a correction factor. Further, by substituting the measured values of the discharge temperature and the discharge capacity into the above correction equation, it was possible to calculate the process capacity at a specific temperature. However, as described above, the discharge capacity has a temperature dependency that increases with increasing temperature, and the discharge capacity measurement value, which is substituted for the conventional correction equation, is a discharge capacity according to the actual temperature, but the measurement value of the discharge temperature applied to the correction equation may differ from the actual temperature. Hence, the process capacity derived from calibration and actual process capacity are inconsistent, which is a problem. These results are based on the principle that the conventional correction equation corrects according to the temperature difference based on the discharge capacity, and the result is inevitable because the discharge capacity is temperature dependent.

Therefore, the inventors of the present invention have derived a correction equation that performs correction based on the value obtained by subtracting the charge capacity from the discharge capacity, given that, in the value of the discharge capacity minus the charge capacity, the temperature dependency is significantly reduced.

In general, as shown in FIG. 1, the discharge capacity tends to increase as the discharge temperature increases, and the discharge capacity has a temperature dependency.

However, as shown in FIGS. 2 and 3, the value obtained by subtracting the charge capacity from the discharge capacity has little variation with temperature. FIG. 2 is a graph showing a discharge capacity and a charge capacity for each temperature. Referring to these drawings, the difference between the discharge capacity when the temperature is 40° C. and the discharge capacity when the temperature is 20° C. is significant. However, the value obtained by subtracting the charge capacity from the discharge capacity is only a very slight difference, so that when the temperature is 40° C. or when the temperature is 20° C., the difference cannot be seen with the naked eye. That is, since the value obtained by subtracting the charge capacity from the discharge capacity shows almost the same level at any temperature, it can be reasonably assumed that, in the conventional process capacity calculation correction equation, instead of correcting based on the discharge capacity, if the correction is performed based on the value obtained by subtracting the charge capacity from the discharge capacity, there will be an effect that the temperature dependency is attenuated.

Hereinafter, a correction equation applied when calculating a process capacity according to the present invention will be described in detail.

The correction equation used for calculating the process capacity of the present invention is a modification from the equation derived through regression analysis of discharge temperature and discharge capacity data. Regression analysis is one of the data analysis methods used in statistics, and is a statistical analysis method that assumes a mathematical model to estimate the functional relationship between variables and estimates the model from the data of measured variables. Basically, since the model that makes the error as small as possible is a good model, methods to find the model that makes the smallest error have been studied. There are methods such as least squares to find the model whose sum is the smallest when the error between the data and the mean is squared and added.

FIG. 4 is a graph showing the results of the regression analysis based on the discharge capacity data according to the discharge temperature according to an embodiment of the present invention. Referring to this, the discharge capacity can have a linear regression function model, and the following equation (1) can be derived.

$$\text{Discharge capacity} = a + \alpha * \log_{10}(\text{discharge temperature}) + \beta * \log_{10}(\text{discharge temperature}); \quad \text{Equation (1)}$$

(where "a" is a constant and $\alpha$ and $\beta$ are correction factors)

Using Equation (1), a correction equation for correcting a discharge capacity at a certain discharge temperature measured during the manufacturing process of a lithium secondary battery to a process capacity ($Q_3$) at a specific temperature ($T_1$) required by the customer can be derived through the following process.

That is, in Equation (1), since a, $\alpha$, and $\beta$ have constant values, Equation (2) in which a specific temperature and process capacity are substituted into Equation (1), and Equation (3) obtained by substituting the actually measured discharge capacity and discharge temperature into Equation (1) above can be derived as follows.

$$\text{Process capacity} = a + \alpha * \log_{10}(\text{specific temperature}) + \beta * \log_{10}(\text{specific temperature})^2; \quad \text{Equation (2)}$$

$$\text{Discharge capacity} = a + \alpha * \log_{10}(\text{discharge temperature}) + \beta * \log_{10}(\text{discharge temperature})^2; \quad \text{Equation (3)}$$

By subtracting Equation (3) from Equation (2), Equation (4) of correcting to the process capacity at a specific temperature using the measured value of discharge capacity and the measured value of discharge temperature is derived.

$$\text{Process capacity} = \text{discharge capacity} - \alpha * \log_{10}(\text{discharge temperature/specific temperature}) - \beta * (\log_{10}(\text{discharge temperature})^2 - \log_{10}(\text{specific temperature})^2); \quad \text{Equation (4)}$$

Referring to Equation (4) above, the discharge capacity measured at the production site of the lithium secondary battery, in order to correct the capacity change that may occur due to the difference between the discharge temperature and the specific temperature, it can be seen that correction is performed by subtracting [$\alpha * \log_{10}$(discharge temperature/specific temperature)+$\beta *(\log_{10}$(discharge temperature)$^2-\log_{10}$(specific temperature))] from the discharge capacity value. In the prior art, the discharge capacity measured at an arbitrary discharge temperature and the specific temperature required by the customer were substituted into the correction equation using the above equation to thereby calculate the process capacity at the specific temperature requested by the customer.

However, as described above, since the discharge capacity applied to the correction equation may not match the discharge capacity at the discharge temperature applied to the correction equation, in the present invention, the discharge capacity, which is the variable of the correction equation, was replaced with (discharge capacity-charge capacity), and the resulting correction equation is as follows.

Process capacity=[(discharge capacity−charge capacity)−$\alpha$*$\log_{10}$(discharge temperature/specific temperature)−$\beta$*($\log_{10}$(discharge temperature)$^2$−$\log_{10}$(specific temperature)$^2$)];    Equation (5)

In addition, since the value corrected based on (discharge capacity−charge capacity) in the Equation (5) has not been corrected at the discharge capacity corresponding to SOC 100%, in order to obtain the same result as corrected at a discharge capacity equivalent to SOC 100%, Equation (6) obtained by multiplying the above equation (5) by a third correction factor $\gamma$ may be derived.

Process capacity=[(discharge capacity−charge capacity)−$\alpha$*$\log_{10}$(discharge temperature/specific temperature)−$\beta$*($\log_{10}$(discharge temperature)$^2$−$\log_{10}$(specific temperature)2)]*$\gamma$;    Equation (6)

The method for deriving the correction factor $\gamma$ is not limited. In one embodiment of the invention, First, at least 30 secondary batteries with a level of ±2$\sigma$ are selected based on the capacity derived by Equation (5) above, and discharge capacity (product inspection capacity) is measured separately as product inspection conditions, to thereby secure data. In addition, the correction factor $\gamma$ can be obtained by dividing the product inspection capacity by the capacity derived by equation (5).

Summarizing the above, the process capacity $Q_3$ at the temperature of $T_2$ required by the customer can be obtained as follows by substituting the discharge capacity $Q_1$ measured at an arbitrary discharge temperature $T_1$ and the shipping charge capacity $Q_2$ into the Equation (6).

$$Q_3=[(Q_1-Q_2)-\alpha*\log_{10}(T_1/T_2)-\beta*(\log_{10}(T_1)^2-\log_{10}(T_2)^2)]*\gamma$$

In addition, since there may be a difference between the activation process conditions at the actual manufacturing site and the activation process conditions required by the customer, and the difference in capacity occurs depending on the difference in the activation process, in order to correct the difference, a capacity correction step according to the difference in the activation process conditions in Equation (6) may be further included.

The difference in the activation process may mean a difference in activation process conditions such as a charge/discharge current value, a discharge voltage value, a charge/discharge rate (C-Rate) and a discharge condition during the activation process, and in order to correct the capacity accordingly, Equation (6) is multiplied by the correction factor. The correction factor for correcting a change in capacity due to a difference in activation process conditions can be derived using a method such as regression analysis. That is, the correction factor can be derived from the correlation between the process capacity by the activation process of the standard required by the customer and the process capacity by the activation process at the manufacturing site.

The process capacity calculation method of the present invention is derived from data measured during a discharge process and a charging process performed at a manufacturing site of a secondary battery. Hereinafter, the discharge process and the charging process will be described in detail.

Generally, secondary batteries are manufactured through an electrode manufacturing process of manufacturing a positive electrode and a negative electrode respectively, an assembly process of inserting an electrode assembly with a separator interposed in the manufactured electrode into a battery case and then injecting an electrolyte, and a formation process of stabilizing the battery structure and makes it usable through charging, aging, and discharging the assembled battery.

The formation process includes an activation process and a grading process.

Specifically, the activation process includes a pre-aging process of aging the battery under certain temperature and humidity conditions so that the electrolyte is impregnated into the electrode and the separator, an initial charge process of charging up to a certain capacity of the battery capacity so that the SEI film is formed on the surface of the negative electrode, an aging process of stabilizing the battery and maintaining it at a constant temperature and humidity for OCV inspection, and a degassing process of degassing the activated gas generated by side reaction of the electrolyte during the activation process.

The grading process may include a discharge process of completely discharging the battery for grading the capacity of the battery, a shipping charge process of charging for product shipment, and a defect inspection process of selectively checking defective batteries. Namely, by measuring the discharge capacity ($Q_1$), the discharge temperature ($T_1$), and the charge capacity ($Q_2$) in the discharge process and the shipping charge process, and substituting them in Equation (5), the process capacity ($Q_3$) at a specific temperature ($T_2$) can be derived.

In the discharge process, the battery after the degassing process is fully charged, and then is fully discharged to measure the discharge temperature ($T_1$) and discharge capacity ($Q_1$). Since the battery generates heat as it is fully discharged, it is difficult to maintain a constant temperature during the discharge period, and the temperature may increase. Therefore, in the correction equation applied to the process capacity calculation method of the present invention, the discharge temperature $T_1$ will mean the average value of the temperature during discharge.

In one embodiment of the present invention, the shipping charge may be performed at a temperature of 20° C. to 50° C., more preferably 25° C. to 40° C. When the temperature of the shipping charge is out of the above range, it is not preferable because the consistency between the value calculated by the correction equation and the actual process capacity may deteriorate.

In addition, in the shipping charge, a current may be flown through a constant current (CC) charging method, or a current may be flown through a constant current/constant voltage (CC/CV) charging method, and the CC/CV charging method is more preferable.

In one embodiment of the present invention, the charge amount at the time of the shipping charge may be SOC 10% to SOC 60%, more preferably SOC 10% to SOC 40%, and most preferably SOC 15% to SOC 30%. When the charge amount at the time of shipping charge exceeds 60%, it is not preferable because the value ($Q_1-Q_2$) obtained by subtracting the charge capacity from the discharge capacity may not be constant as the temperature changes.

The process capacity calculation system of the present invention will be described.

A process capacity calculation system of a lithium secondary battery of the present invention includes:

a database unit configured to store discharge capacity data according to a discharge temperature;

an analysis unit configured to derive a correction equation for correcting to a process capacity ($Q_3$) at a specific temperature ($T_2$) through regression analysis of temperature and discharge capacity data stored in the database unit;

a measuring unit configured to measure a discharge temperature ($T_1$) and a discharge capacity ($Q_1$) during a discharge process performed after a degassing process of a lithium secondary battery, and a charge capacity ($Q_2$) during a shipping charge; and a calculation unit configured to calculate a process capacity at a specific temperature $T_2$ by substituting the discharge capacity, the discharge temperature, and the charge capacity measured by the measuring unit into the correction equation derived by the analysis unit, in which the correction equation derived from the analysis unit has the discharge temperature ($T_1$), the discharge capacity ($Q_1$) and the charging capacity ($Q_2$) as variables.

The database unit is a unit for storing discharge capacity data according to the discharge temperature. As described above, the lithium secondary battery having undergone the degassing process is fully charged and then discharged for the capacity grading, and during the discharge process, the discharge temperature and discharge capacity are measured. The database unit stores the discharge capacity value according to the measured discharge temperature. At this time, the discharge temperature may be an average value of temperatures measured during the entire period of discharge.

The analysis unit regresses the discharge temperature and discharge capacity data stored in the database unit to derive a correlation function between the discharge temperature and the discharge capacity, and derives a correction equation for correcting to a process capacity $Q_3$ at a specific temperature $T_2$ by using the measured discharge temperature and discharge capacity, from the correlation function.

The analysis unit may perform a regression analysis of the data of the discharge capacity value according to the discharge temperature stored in the database unit to thereby derive a linear regression function based on the correlation between the discharge capacity and the discharge temperature, as illustrated in FIG. 4. The linear regression function is generated by modeling linear correlation between the discharge capacity as a dependent variable and the discharge temperature as an independent variable by regression analysis. By using the linear regression function, a process capacity calculation correction equation for correcting to a process capacity $Q_3$ at a specific temperature $T_1$ using a discharge capacity $Q_1$ measured at an arbitrary discharge temperature $T_1$ is derived. The details of the derivation process of the correction equation are as described above, and the above-described equations (4) and (5) may be derived by the analysis unit.

The measuring unit measures a discharge temperature ($T_1$) and a discharge capacity ($Q_1$) during a discharge process performed after a degassing process of a lithium secondary battery, and a charge capacity ($Q_2$) during a shipping charge. In order to measure the capacity of the lithium secondary battery after the degassing process, the discharge temperature ($T_1$) and the discharge capacity ($Q_1$) are respectively measured during a discharge process in which the battery is fully charged and then fully discharged. In addition, since the correction equation of the present invention is characterized in that correction is made from a value obtained by subtracting charging capacity from discharge capacity ($Q_1-Q_2$) instead of being corrected from the discharge capacity, the charge capacity ($Q_2$) at the time of shipping charge is measured.

The calculation unit calculates the process capacity $Q_3$ at a specific temperature $T_2$ by substituting the discharge capacity ($Q_1$), the discharge temperature ($T_1$) and the charge capacity ($Q_2$) measured by the measuring unit into the correction equation derived by the analysis unit. The process capacity value calculated by the calculation unit is corrected based on the value ($Q_1-Q_2$) obtained by subtracting the charge capacity from the discharge capacity, thereby reducing the temperature dependence and improving the actual process capacity and consistency.

Hereinafter, the present invention will be described in more detail through examples below.

Example 1

A degassing process was completed for 7,305 secondary batteries designed to have a capacity of P, then the batteries were fully charged and then discharged to measure the discharge temperature and discharge capacity, and then the shipping charge was performed for the batteries to the level of SOC 18%. In the following equation, the measured discharge temperature and discharge capacity were respectively substituted to be corrected to the process capacity at 25° C.

$$\text{Process capacity} = [(\text{discharge capacity} - \text{charge capacity}) - \alpha * \log_{10}(\text{discharge temperature}/25° \text{ C.}) - \beta * (\log_{10}(\text{discharge temperature}) - \log_{10}(25° \text{ C.})^2)] * \gamma$$

(The above $\alpha$, $\beta$, and $\gamma$ are correction factors, respectively, and are constants derived by regression analysis, and their specific values are omitted here.)

Example 2

A degassing process was completed for 24,332 secondary batteries designed to have a capacity of P, then the batteries were fully charged and then discharged to measure the discharge temperature and discharge capacity, and then the shipping charge was performed for the batteries to the level of SOC 30%. In the equation of the above example, the measured discharge temperature and discharge capacity were respectively substituted to be corrected to the process capacity at 25° C.

Comparative Example 1

A degassing process was completed for 7,305 secondary batteries designed to have a capacity of P, then the batteries were fully charged and then discharged to measure the discharge temperature and discharge capacity, and then the shipping charge was performed for the batteries to the level of SOC 18%. In the following equation, the measured discharge temperature and discharge capacity were respectively substituted to be corrected to the process capacity at 25° C.

$$\text{Process capacity} = \text{discharge capacity} - \alpha * \log_{10}(\text{discharge temperature}/25° \text{ C.}) - \beta * (\log_{10}(\text{discharge temperature})^2 - \log_{10}(25° \text{ C.})^2)$$

(The above $\alpha$, $\beta$, and $\gamma$ are correction factors, respectively, and are constants derived by regression analysis, and their specific values are omitted here.)

Comparative Example 2

A degassing process was completed for 24,332 secondary batteries designed to have a capacity of P, then the batteries were fully charged and then discharged to measure the discharge temperature and discharge capacity, and then the shipping charge was performed for the batteries to the level of SOC 30%. In the equation of the above comparative example, the measured discharge temperature and discharge capacity were respectively substituted to be corrected to the process capacity at 25° C.

Experimental Example 1: Consistency Evaluation

In order to evaluate the consistency between the process capacity calculated by the correction equation and the capacity of product inspection, 50 cells were extracted from the sample populations of Example 1 and Comparative Example 1 to obtain p-value (P) values, and the results are shown in Table 1. P-value (P) is defined as a probability that a statistical value is more than the actually observed value, assuming that the null hypothesis is correct in statistics. The p-value (P) is derived by a mathematical formula widely known in the field of statistics, and detailed description of the mathematical formula will be omitted in the specification of the present invention. When the P value>0.05, it means that there is a difference between the calculated process capacity and the capacity value by product inspection, and when the P value<0.05, it means that there is no difference between the calculated process capacity and the capacity value by product inspection.

TABLE 1

|  | Example 1 | Comparative Example 1 |
|---|---|---|
| p-value | 0.002 | 0.054 |

Experimental Example 2: Ppk, Cpk Evaluation

In order to confirm the effect of the present invention, the short-term process capability index and the long-term process capability index are respectively obtained based on process capacity data which are calculated from respective sample groups of Examples 1 and 2, Comparative Examples 1 and 2, and the results are shown in Table 2. A process capability index is the ratio of process capability ($6\sigma$) to the width (T) of the standard, and the value indicates how much the process has the capability to produce a standard product. A short-term process capability is a capability that does not include inter-group fluctuations, and a long-term capability is capability that includes both intra-group/inter-group fluctuations. In general, Cpk and Ppk required for mass production approval are 1.33 or more and 1.67 or more, respectively.

TABLE 2

|  | Cpk | Ppk |
|---|---|---|
| Example 1 | 1.69 | 1.74 |
| Example 2 | 4.23 | 3.05 |
| Comparative Example 1 | 0.99 | 0.98 |
| Comparative Example 2 | 1.70 | 1.45 |

As shown in Table 1, the calculation method of the present invention has a much greater probability of being matched with the actually measured value compared to the calculation method using a conventional correction equation. Therefore, it can be seen that the process capacity calculation method of the present invention has improved consistency of being consistent with the process capacity measured in product inspection.

And, as shown in Table 2, in the distribution of the calculated process capacity of Examples 1 and 2 according to the calculation method of the present invention, both Cpk and Ppk satisfy the mass production approval condition, but in the distribution of the calculated process capacity of Comparative Example 1 and 2 according to the conventional correction equation, they do not satisfy the mass production approval condition.

As described above, the process capacity calculation method of the present invention was found to have high consistency with the product capacity actually measured, and excellent dispersibility.

The process capacity calculation method of the present invention is based on the fact that the value obtained by subtracting the charge capacity from the discharge capacity is almost constant at any temperature, and the following experiment was conducted to confirm the fact.

The secondary battery, which had been degassed, was fully charged and discharged. At this time, the discharge temperature was changed to 25° C., 30° C., 35° C., 40° C. and 45° C. Subsequently, the charging was performed with different charging amounts of SOC 15% (Group 1), SOC 30% (Group 2), and SOC 60% (Group 3).

The (discharge capacity–charge capacity) values of all battery groups (group 1) shipped and charged at SOC 15% were measured for each temperature, and the difference between the maximum value and the minimum value are shown in Table 3. For the battery groups charged with SOC 30% (group 2) and SOC 60% (group 3), the difference between the maximum value and the minimum value of the (discharge capacity–charge capacity) was calculated and shown in Table 3.

Then, the discharge capacity at the temperature was measured as a comparison group, and the difference between the maximum value and the minimum value is shown in Table 3.

TABLE 3

|  | First group | Second group | Third group | Comparison group |
|---|---|---|---|---|
| Max-Min (mAh/° C.) | 34.7 | 49.6 | 59.0 | 284.8 |

As shown in Table 3, the difference between the maximum and minimum values of the capacity according to the temperature change was found to be much larger in the comparison group when the first to third groups were compared with the comparison group. Therefore, it can be seen that the value obtained by subtracting the charge capacity from the discharge capacity showed that the temperature dependency was significantly attenuated, unlike the discharge capacity. In addition, it can be seen that the temperature dependency of the first group having a relatively small charge amount is smaller than that of the third group having a relatively large charge amount. Hence, in the present invention, it is expected that the process capacity with minimal temperature dependency can be calculated if the shipping charge amount is set small and the correction equation of the present invention is used.

The above description is merely illustrative of the technical idea of the present invention, and those skilled in the art to which the present invention pertains may make various modifications and variations without departing from the essential characteristics of the present invention. Therefore, the embodiments disclosed in the present invention are not intended to limit the technical spirit of the present invention, but to explain the protection scope of the present invention and should be interpreted by the claims below, and it should be interpreted that all technical spirits within the equivalent scope are included in the scope of the present invention.

The invention claimed is:

1. A method of calculating a process capacity at a specific temperature of a lithium secondary battery, measuring a discharge temperature ($T_1$) and a discharge capacity ($Q_1$) during a discharge process performed after a degassing process of the lithium secondary battery; and measuring a charge capacity ($Q_2$) during a shipping charge, wherein a correction to the process capacity ($Q_3$) at the specific temperature ($T_2$) is performed using a value ($Q_1-Q_2$) obtained by subtracting the charge capacity ($Q_2$) measured during the shipping charge from the discharge capacity ($Q_1$) measured at the discharge temperature ($T_1$), where the discharge temperature ($T_1$) is not equal to the specific temperature ($T_2$), and wherein, when the process capacity at the specific temperature meets a capacity standard of a customer, the method includes shipping the lithium secondary battery to the customer.

2. The method of claim 1, wherein the shipping charge is performed by a Constant Current-Constant Voltage charge method at a temperature of 20° C. to 50° C.

3. The method of claim 1, wherein the shipping charge is performed by charging the lithium secondary battery to a level of State of Charge (SOC) 10% to SOC 60%.

4. The method of claim 1, wherein the shipping charge is performed by charging the lithium secondary battery to a level of State of Charge (SOC) 10% to SOC 40%.

5. The method of claim 1, further comprising:

an equation deriving step of deriving a regression equation of discharge temperature-discharge capacity through a regression analysis of discharge capacity data according to discharge temperatures; and a correction equation deriving step of deriving a correction equation for performing the correction to the process capacity ($Q_3$) at the specific temperature ($T_2$) from the derived regression equation, wherein the derived correction equation has the value ($Q_1-Q_2$), the discharge temperature ($T_1$), and the specific temperature ($T_2$) as variables.

6. The method of claim 5, wherein the correction equation has at least one correction factor for compensating for a difference in capacity caused by a difference between the specific temperature ($T_2$) and the discharge temperature ($T_1$).

7. The method of claim 5, further comprising: a step of multiplying the correction equation by a correction factor to compensate for a difference caused by differences in activation process conditions after the correction equation deriving step.

8. The method of claim 5, wherein the discharge temperature ($T_1$) and the discharge capacity ($Q_1$), which are variables of the correction equation, are respectively the discharge temperature and the discharge capacity measured while performing a full discharge after a full charge for the lithium secondary battery after having completed the degassing process.

9. The method of claim 1, wherein the discharge temperature ($T_1$) is an average value of temperatures during performing a discharge.

* * * * *